(12) United States Patent
Takewaka et al.

(10) Patent No.: US 6,645,863 B2
(45) Date of Patent: Nov. 11, 2003

(54) METHOD OF MANUFACTURING SEMICONDUCTOR DEVICE AND SEMICONDUCTOR DEVICE

(75) Inventors: Hiroki Takewaka, Tokyo (JP); Takao Kamoshima, Tokyo (JP); Junko Izumitani, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 86 days.

(21) Appl. No.: 09/986,001

(22) Filed: Nov. 7, 2001

(65) Prior Publication Data

US 2002/0177325 A1 Nov. 28, 2002

(30) Foreign Application Priority Data

May 25, 2001 (JP) ........................................ 2001-157026

(51) Int. Cl.[7] .............................................. H01L 21/00
(52) U.S. Cl. ......................... 438/692; 216/89; 438/693; 438/745
(58) Field of Search ................. 438/691, 692, 438/693, 745, 754; 216/38, 88, 89, 91, 100

(56) References Cited

FOREIGN PATENT DOCUMENTS

JP            6-053248        2/1994

*Primary Examiner*—William A. Powell
(74) *Attorney, Agent, or Firm*—Oblon, Spivak, McClelland, Maier & Neustadt, P.C.

(57) ABSTRACT

The invention provides a method of manufacturing a semiconductor device which can reduce or prevent abrasive material from remaining in an indentation in a surface after a CMP process.

After forming a titanium nitride film (5), a tungsten film (6) is formed on an entire surface. The temperature is set at approximately 430° C. for the reaction and, first, 50 sccm of $WF_6$, 10 sccm of $SiH_4$ and 1000 sccm of $H_2$ are used in the atmosphere of 30 Torr of Ar, $N_2$ so as to form a seed layer with a film thickness of approximately 100 nm. After that, in the atmosphere of 80 Torr of Ar, $N_2$, 75 sccm of $WF_6$ and 500 sccm of $H_2$ are used as a reactive gas so as to layer a film with a thickness of approximately 300 nm. The tungsten film (6) has grains (6a) in a pillar form of which the grain diameter is small to the degree that the abrasive material (50) used in the CMP process does not easily become caught in the gaps between the grains. Concretely, the tungsten film (6) has grains (6a) of which the diameter is approximately 10 nm to 20 nm.

15 Claims, 7 Drawing Sheets

METHOD OF MANUFACTURING SEMICONDUCTOR DEVICE AND SEMICONDUCTOR DEVICE

BACKGROUND OF THE INVENTION

1. Field of the Invention

The present invention relates to a method of manufacturing a semiconductor device and a structure of a semiconductor device, in particular, to a method of manufacturing a semiconductor device comprising the step of filling in a metal wire within a contact hole according to a CMP (chemical mechanical polishing) method.

2. Description of the Background Art

Figure 19:
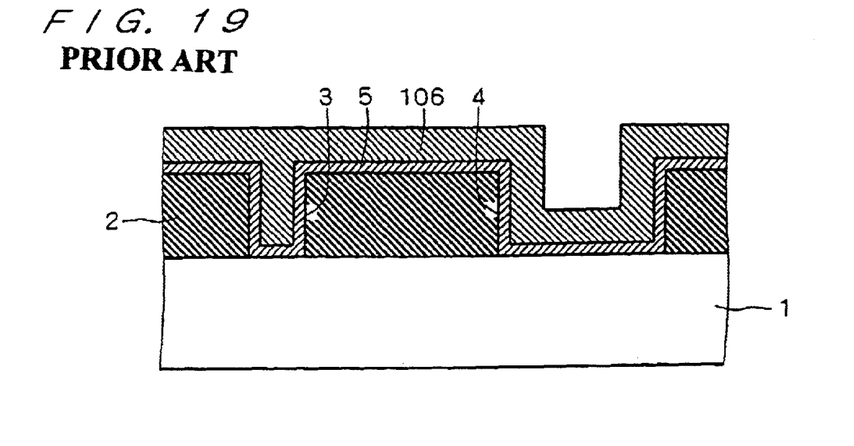
FIG. 19 and FIG. 20 are cross section views showing, in order of process steps, a method of manufacturing a semiconductor device according to a background art.
Figure 20:
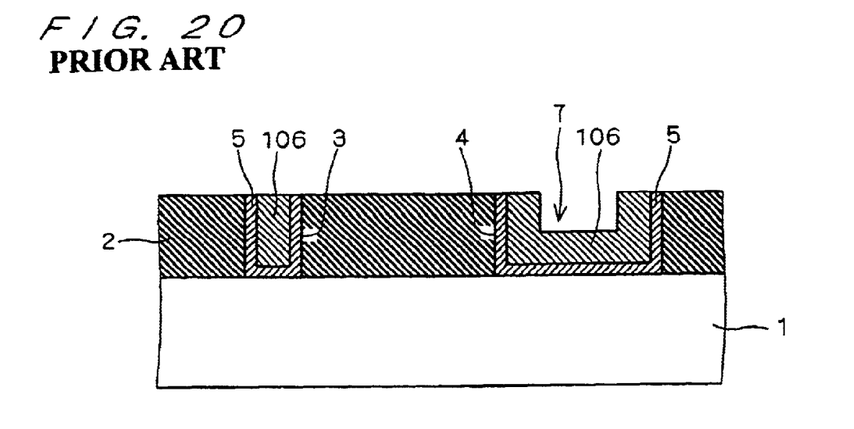

FIGS. 19 and 20 are cross section views showing a conventional method for manufacturing a semiconductor device in order of process steps. In reference to FIG. 19, first, a semiconductor element such as an MOSFET is formed in a silicon substrate 1 according to a well-known method and, after that, a silicon oxide film 2 as an interlayer insulating film is formed on the silicon substrate 1. Next, a contact hole 3 which functions as a hole for electrical connection between a wire and a substrate and a recess 4 which functions as an alignment mark are formed in the silicon oxide film 2 according to anisotropic dry etching method. Through the creation of the contact hole 3, a part of the source and drain regions of the MOSFET is exposed while through the creation of the recess 4, a part of the top surface of the silicon substrate 1 is exposed. The width of the recess 4 is significantly broader than the width of the contact hole 3.

Next, a titanium nitride film 5 as a barrier metal is formed on the entire surface according to a spattering method, or the like. Next, a tungsten film 106 as a conductive plug with the film thickness of approximately 400 nm is formed on the entire surface so as to fill in the contact hole 3 according to a CVD method, or the like. Concretely, the temperature is set at approximately 470° C. for the reaction and, first, 25 sccm of $WF_6$, 10 sccm of $SiH_4$ and 800 sccm of $H_2$ are used as a reactive gas in the atmosphere of 30 Torr of Ar, $N_2$ so as to layer a seed layer with a film thickness of approximately 100 nm. After that, 75 sccm of $WF_6$ and 500 sccm of $H_2$ are used as a reactive gas in the atmosphere of 80 Torr of Ar, $N_2$ so as to layer a film with a thickness of approximately 300 nm.

In reference to FIG. 20, next, the tungsten film 106 and the titanium nitride film 5 are removed through polishing until the top surface of the silicon oxide film 2 is exposed by means of a CMP method. At this time, the contact hole 3 is completely filled in with the tungsten film 106 while the recess 4 having a broad width is not completely filled in with the tungsten film 106 and, therefore, an indentation 7 is created within the recess 4 as shown in FIG. 20. After that, as the final process of the CMP step, the wafer is cleaned.

Figure 21:
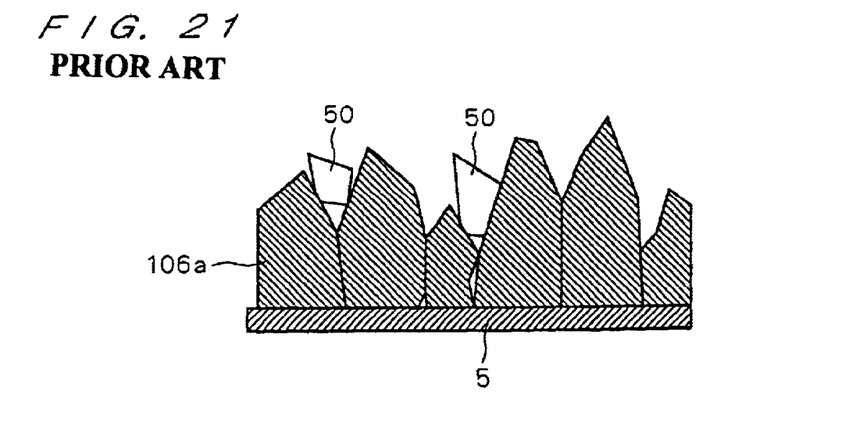
FIG. 21 is a cross section view showing the partially enlarged structure shown in FIG. 20.

In the above described conventional method of manufacturing a semiconductor device, however, the following problem arises. FIG. 21 is a cross section view showing a partially enlarged view of the structure shown in FIG. 20. Concretely, the titanium nitride film 5 and the tungsten film 106 formed within the recess 4 are shown partially enlarged. The tungsten film 106 has grains 106a in a pillar form with a diameter of approximately 70 nm.

Though a portion of the abrasive material accumulates within the indentation 7 through the CMP process, most of it can be removed through cleaning after polishing. However, as shown in FIG. 21, since the diameter of the grains 106a is comparatively large, the unevenness of the surface of the tungsten film 6 is comparatively large. Therefore, a portion of the abrasive material 50 which has accumulated in gaps between the grains 106a cannot be adequately removed through cleaning and becomes attached to the grains 106a as foreign matter. As a result, according to a conventional method of manufacturing a semiconductor device, a problem arises that the abrasive material 50 which has attached to the grains 106a again becomes attached to the surface of the wafer in the subsequent step so as to cause a wire pattern defect or a short circuit between the wires.

SUMMARY OF THE INVENTION

According to the first aspect of the present invention, a method of manufacturing a semiconductor device comprises the steps of: (a) preparing a substrate; (b) forming a first film on the substrate; (c) forming a recess by partially hollowing a top surface of the first film in the direction toward the substrate; (d) forming a second film on a structure gained in step (c) with a film thickness such that the recess is not completely filled in; and (e) removing through polishing the second film in a part which is located above the top surface of the first film, wherein a fine grain layer, which has grains of which the diameter is small to the degree that the abrasive material used for polishing in step (e) does not easily become caught in the gaps between the grains, is formed on, at least, a top surface of the second film.

In addition, according to the second aspect of the present invention, a method of manufacturing a semiconductor device is a method of manufacturing a semiconductor device according to the first aspect, wherein the second film where the diameter of the grains in the fine grain layer is approximately 10 nm to 20 nm is formed in step (d).

In addition, according to the third aspect of the present invention, a method of manufacturing a semiconductor device is a method of manufacturing a semiconductor device according to the first or the second aspect, wherein the second film comprising the fine grain layer throughout all the film thickness is formed in step (d).

In addition, according to the fourth aspect of the present invention, a method of manufacturing a semiconductor device is a method of manufacturing a semiconductor device according to the first or the second aspect, wherein the second film having the fine grain layer in only the top surface is formed in step (d).

In addition, according to the fifth aspect of the present invention, a method of manufacturing a semiconductor device comprises the steps of: (a) preparing a substrate; (b) forming a first film on the substrate; (c) forming a first recess by partially hollowing a top surface of the first film in the direction toward the substrate; (d) forming a second film on a structure obtained in step (c) with a film thickness such that the recess is not completely filled in; (e) removing a top surface of the second film by means of isotropic etching; and (f) after step (e), removing through polishing a part of the second film which is located above the top surface of the first film.

In addition, according to the sixth aspect of the present invention, a method of manufacturing a semiconductor device comprises the steps of: (a) preparing a substrate; (b) forming a first film on the substrate; (c) forming a recess by partially hollowing a top surface of the first film in the direction toward the substrate; (d) forming a second film on a structure obtained in step (c) with a film thickness such that the recess is not completely filled in; (e) forming a third film in a thin film form on the second film; (f) removing through polishing a parts of the second and third films which are located above the top surface of the first film; and (g) after step (f), removing the third film which remains in the recess.

In addition, according to the seventh aspect of the present invention, a method of manufacturing a semiconductor device comprises the steps of: (a) preparing a substrate; (b) forming a first film on the substrate; (c) forming a first recess by partially hollowing a top surface of the first film in the direction toward the substrate; (d) forming a second film on a structure obtained in step (c) with a film thickness such that the first recess is not completely filled in; (e) forming a third film with a film thickness such that the level of a top surface thereof agrees with, or is higher than, the level of the top surface of the first film in a second recess which is defined by a top surface of a part of the second film which is formed in the first recess; (f) removing through polishing a part of the second film which is located above the top surface of the first film; and (g) after step (f), removing the third film which remains in the second recess.

In addition, a method of manufacturing a semiconductor device according to the eighth aspect of the present invention is a method of manufacturing a semiconductor device according to the sixth or the seventh aspect, wherein, in step (g) the third film is removed through wet etching and the etching rate of the third film in the etching solution used for the wet etching is significantly greater than the etching rate of the first film in the etching solution.

In addition, according to the ninth aspect of the present invention, a semiconductor device comprises: a substrate; a first film formed on the substrate; a recess partially formed in a top surface of the first film; and a second film formed on the sides and the bottom of the recess with a film thickness such that the recess is not completely filled in, wherein the semiconductor device is characterized in that a fine grain layer of which the diameter of the grains is approximately 10 nm to 20 nm is formed on, at least, the top surface of the second film.

According to the first aspect of the present invention, a variety of problematic conditions due to abrasive material becoming attached to the grains that later becomes again attached to the surface of the wafer in subsequent steps such as the occurrence of wire pattern defects or short circuits between wires can be prevented.

In addition, according to the second aspect of the present invention, since the diameter of the grains is sufficiently small, the amount of the abrasive material which becomes attached to the grains can be effectively reduced.

In addition, according to the third aspect of the present invention, since only one type of material may be used for the second film, the number of manufacturing steps can be reduced in comparison with the case where a plurality of types of materials are used.

In addition, according to the fourth aspect of the present invention, since a material which is excellent for covering steps can be used on the parts other than the top surface of the second film, the degree of filling in within the recess of the second film can be increased.

In addition, according to the fifth aspect of the present invention, the grains on the top surface of the second film can be changed from a rugged, uneven condition to a smooth, rounded condition by means of isotropic etching in step (e). Thereby, the abrasive material can be prevented from becoming attached to the grains.

In addition, according to the sixth aspect of the present invention, the abrasive material accumulates on the third film in a thin film form is step (f). Then, the third film is removed in the subsequent step (g) and, at that time, the abrasive material is also removed so that the abrasive material can be prevented from remaining within the recess.

In addition, according to the seventh aspect of the present invention, after the third film is formed within the second recess in step (e), polishing of the second film is carried out in step (f). Accordingly, the abrasive material can be prevented from remaining within the second recess.

In addition, according to the eighth aspect of the present invention, at the time when the third film is removed in step (g) the removal of the first film, at the same time, can be avoided.

In addition, according to the ninth aspect of the present invention, foreign matter attached to the grains can be prevented from becoming again attached to the wafer surface in subsequent steps of a manufacturing process for a semiconductor device. Therefore, a semiconductor device with a high reliability can be gained.

The present invention is provided to solve these problems and has a purpose of providing a method of manufacturing a semiconductor device which can reduce or prevent abrasive material from remaining within an indentation in the surface after a CMP process.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
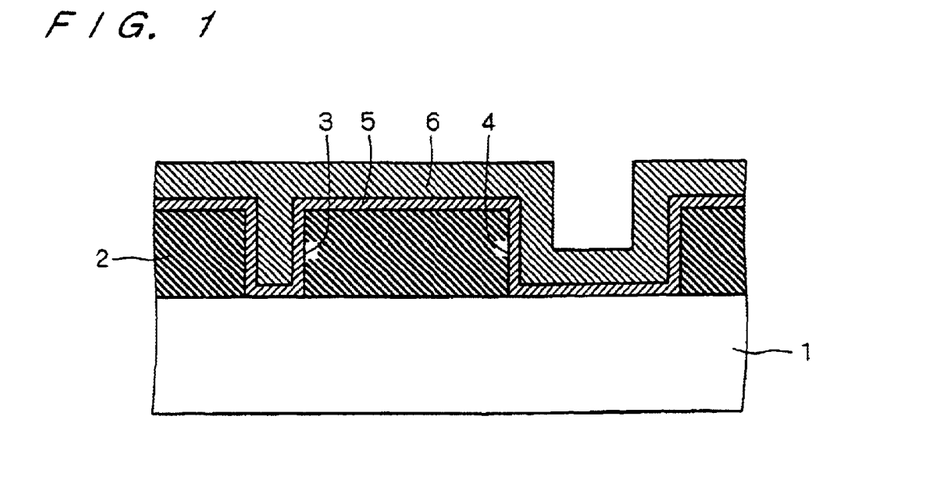
FIG. 1 and FIG. 2 are cross section views showing, in order of process steps, a method of manufacturing a semiconductor device according to a first preferred embodiment of the present invention.
Figure 2:
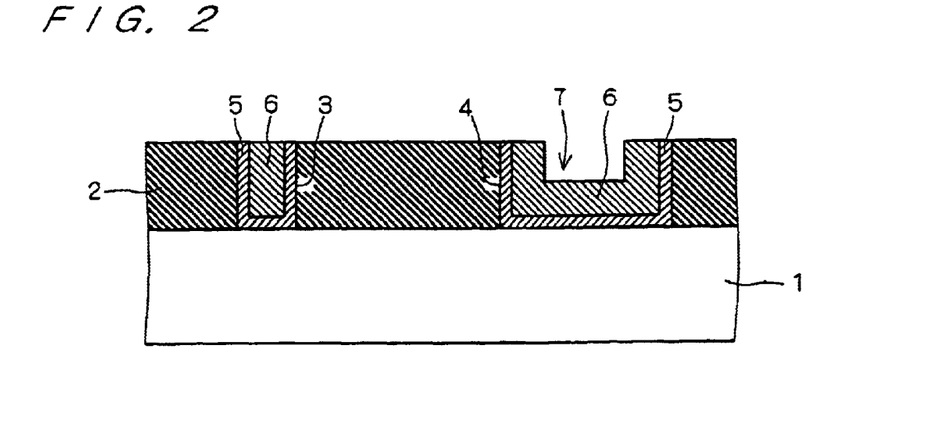

FIGS. 1 and 2 are cross section views showing, in order of process steps, a method of manufacturing a semiconductor device according to the first preferred embodiment of the present invention. In reference to FIG. 1, first, a semiconductor element such as an MOSFET is formed in a silicon substrate 1 according to a well-known method and, after that, a silicon oxide film 2 is formed as an interlayer insulating film on the silicon substrate 1. Next, a contact hole 3 which functions as a hole for electrical connection between a wire and a substrate and a recess 4 which functions as an alignment mark are formed in the silicon oxide film 2 according to anisotropic dry etching method. Through the creation of the contact hole 3, a part of the source and drain regions of the MOSFET is exposed while through the creation of the recess 4, a part of the top surface of the silicon substrate 1 is exposed. The width of the recess 4 is significantly broader than the width of the contact hole 3.

Next, a titanium nitride film 5 is formed as a barrier metal on the entire surface by means of a spattering method, or the like. Here, a conductive film other than the titanium nitride film may be formed. Next, a tungsten film 6 is formed by means of a CVD method, or the like, as a conductive plug on the entire surface with a film thickness of approximately 400 nm so as to fill in the contact hole 3. Concretely, the temperature is set at approximately 430° C. for the reaction and, first, 50 sccm of $WF_6$, 10 sccm of $SiH_4$ and 1000 sccm of $H_2$ are used as a reactive gas in the atmosphere of 30 Torr of Ar, $N_2$ so as to form a seed layer with a film thickness of approximately 100 nm. After that, 75 sccm of $WF_6$ and 500 sccm of $H_2$ are used as a reactive gas in the atmosphere of 80 Torr of Ar, $N_2$ so as to layer a film with a thickness of approximately 300 nm. Here, a conductive film other than a tungsten film may be formed.

In reference to FIG. 2, next, the tungsten film 6 and the titanium nitride film are removed through polishing until the top surface of the silicon oxide film 2 is exposed by means of a CMP method. At this time, the contact hole 3 is completely filled in with the tungsten film 6 while the recess 4 having a broad width is not completely filled in with the tungsten film 6 and, thereby, an indentation 7 is formed in the recess 4 as shown in FIG. 2. After that, the wafer is cleaned as the final step of the CMP process.

Figure 3:
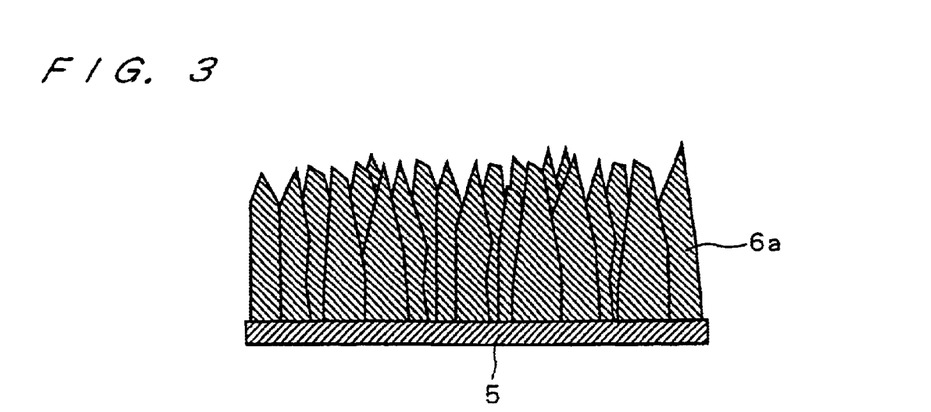
FIG. 3 is a cross section view showing the partially enlarged structure shown in FIG. 2.

FIG. 3 is a cross section view showing a partially enlarged view of the structure shown in FIG. 2. Concretely, the titanium nitride film 5 and the tungsten film 6 formed within the recess 4 are shown partially enlarged. The tungsten film 6 has grains 6a in a pillar form of which the grain diameter is small to the degree that the abrasive material 50 used in a CMP process does not easily become caught in the gaps between the grains by making the conditions at the time of film formation different from those of the conventional technology. Concretely, the tungsten film 6 has grains 6a of which the diameter is approximately 10 nm to 20 nm. Since the diameter of the grains 6a is smaller than the diameter of the grains 106a shown in FIG. 21, the unevenness of the surface of the tungsten film 6 is made less than the unevenness of the surface of the tungsten film 106 according to a background art shown in FIG. 21.

Figure 4:
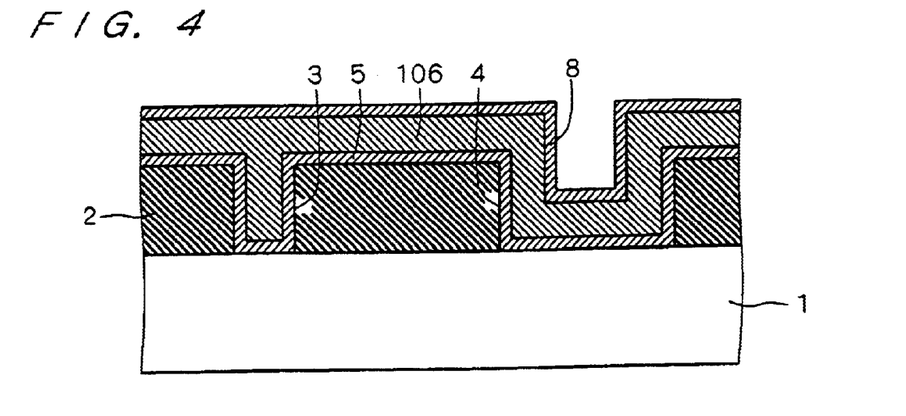
FIG. 4 and FIG. 5 are cross section views showing, in order of process steps, a method of manufacturing a semiconductor device according to a modified example of the first preferred embodiment of the present invention.
Figure 5:
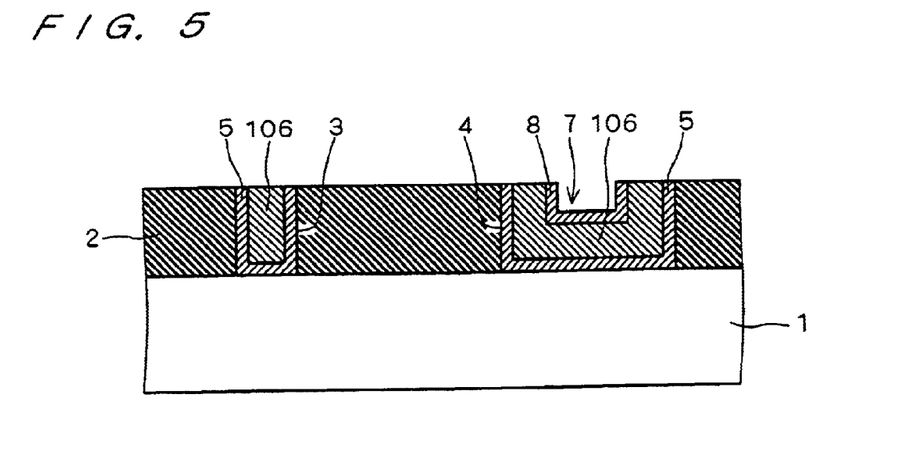

FIGS. 4 and 5 are cross section views showing, in order of process steps, a method of manufacturing a semiconductor device according to a modified example of the first preferred embodiment. In reference to FIG. 4, first, the structure shown in FIG. 19, formed through the same steps as in a background art, is gained and, after that, a tungsten film 8 is formed on the entire surface by means of a CVD method. The same conditions as the film formation conditions of the above described tungsten film 6 are used for the film formation of the tungsten film 8.

Figure 6:
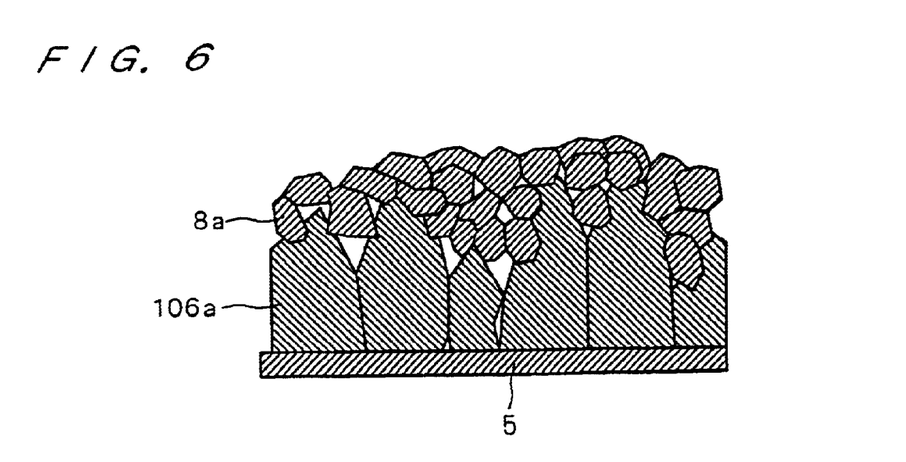
FIG. 6 is a cross section view showing the partially enlarged structure shown in FIG. 5.

FIG. 6 is a cross section view showing a partially enlarged view of the structure shown in FIG. 5. Concretely, the titanium nitride film 5 and the tungsten film 106, 8 formed in the recess 4 are shown partially enlarged. The tungsten film 106 has grains 106a of which the diameter is approximately 70 nm while the tungsten film 8 has grains 8a of which the diameter is approximately 10 nm to 20 nm. The unevenness of the surface of the complex film comprising the tungsten film 106 and the tungsten film 8 (that is to say, unevenness of the surface of the tungsten film 8) has been made less than the unevenness of the surface of the tungsten film 106 according to a background art shown in FIG. 21.

In this manner, in accordance with a method of manufacturing a semiconductor device according to the first preferred embodiment, the tungsten film 6 which has a fine grain layer, comprising grains 6a of which the grain diameter is comparatively small, is formed in the recess 4. In addition, in accordance with a method of manufacturing a semiconductor device according to a modified example of the first preferred embodiment, the tungsten film 8 which has a fine grain layer, comprising grains 8a of which the grain diameter is comparatively small, is formed on the surface in the recess 4. Accordingly, the unevenness of the surface of the tungsten film formed in the recess 4 becomes smaller than in a background art and, therefore, in the case that a portion of the abrasive material accumulates in the indentation 7 as a result of the CMP process, the abrasive material 50 can be prevented from becoming caught in the gaps between the grains 6a, 8a. As a result, the occurrence of wire pattern defects or short circuits between wires caused by the abrasive material 50 becoming again attached to the wafer surface in the subsequent steps can be prevented so as to gain a semiconductor device of a high reliability.

In particular, in accordance with the method of manufacturing a semiconductor device according to the modified example of the first preferred embodiment, the tungsten film 106 can be formed by prioritizing the coverage for the steps regardless of the grain diameter of the grains 106a. On the other hand, in accordance with the method of manufacturing a semiconductor device according to the first preferred embodiment, it is not necessary to form two types of tungsten films 106 and 8 and, thereby, the number of process steps can be prevented from increasing in comparison with the modified example of the first preferred embodiment.

Second Preferred Embodiment

In the second preferred embodiment, after gaining the structure shown in FIG. 20 formed through the same steps as in a background art, the wafer is immersed in the etching solution (for example, fluoric acid solution) which has a solubility to the tungsten film 106 and, thereby, the surface of the tungsten film 106 is removed through wet etching. Or, in place of immersion in the fluoric acid solution, the surface of the tungsten film 106 may be removed through isotropic etching back in the atmosphere of 150 sccm of $SF_6$, 70 sccm of Ar, 170 mTorr and 250 Wrf. That is to say, the surface of the tungsten film 106 may be removed through isotropic etching.

Figure 7:
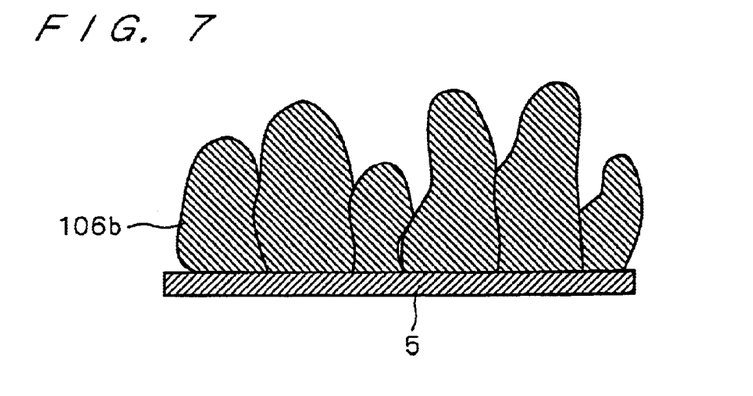
FIG. 7 is a cross section view showing the condition of a tungsten film after wet etching processing with respect to a method of manufacturing a semiconductor device according to a second preferred embodiment of the present invention.
Figure 8:
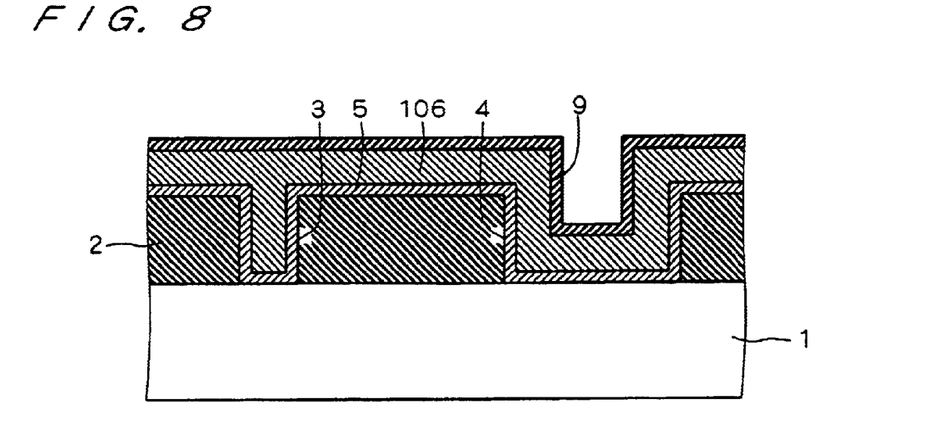
FIG. 8 to FIG. 12 are cross section views showing, in order of process steps, a method of manufacturing a semiconductor device according to a third preferred embodiment of the present invention.

FIG. 7 is a cross section view showing the condition of the tungsten film 106 after the wet etching process corresponding to FIG. 21. The corners of the grains 106a are eliminated and, thereby, grains 106b of which the surfaces are rounded are gained.

In this manner, in accordance with the method of manufacturing a semiconductor device according to the second preferred embodiment, the surface of the tungsten film 106 is removed by means of isotropic etching before the CMP process. And, thereby, the surface of the tungsten film 106 can be changed from a rugged, uneven condition (grains 106a) to a smooth, rounded condition (grains 106b). As a result, even in the case that a portion of the abrasive material accumulates in the indentation 7 as a result of the CMP process, the abrasive material 50 can be prevented from becoming caught in the gaps between the grains 106b.

Third Preferred Embodiment

FIGS. 8 to 12 are cross section views showing, in order of process steps, a method of manufacturing a semiconductor device according to the third preferred embodiment of the present invention. In reference to FIG. 8, first, the structure shown in FIG. 19 is gained by being formed through the same steps as in a background art and, after that, a TEOS (tetra etyle ortho silicate) oxide film 9 which has a film thickness of approximately 50 nm is formed on the entire surface by means of a plasma CVD method.

Figure 9:
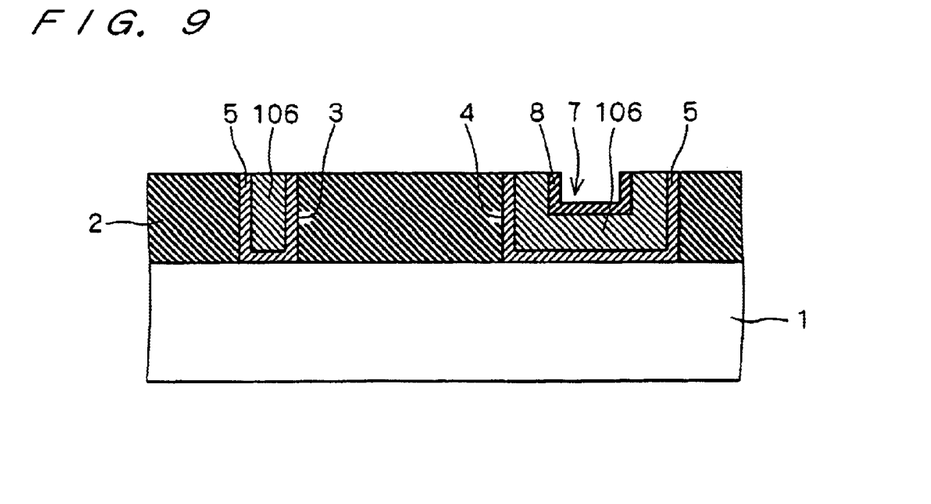

In reference to FIG. 9, next, the TEOS oxide film 9, the tungsten film 106 and the titanium nitride film 5 are removed through polishing by means of a CMP method until the top surface of the silicon oxide film 2 becomes exposed. The film thickness of the TEOS oxide film 9 is approximately 50 nm which is sufficiently thin and, therefore, is removed by the CMP processing. Here, since the TEOS oxide film 9 in the indentation 7 is not polished, the TEOS oxide film 9 on this part remains on the tungsten film 106.

Figure 10:
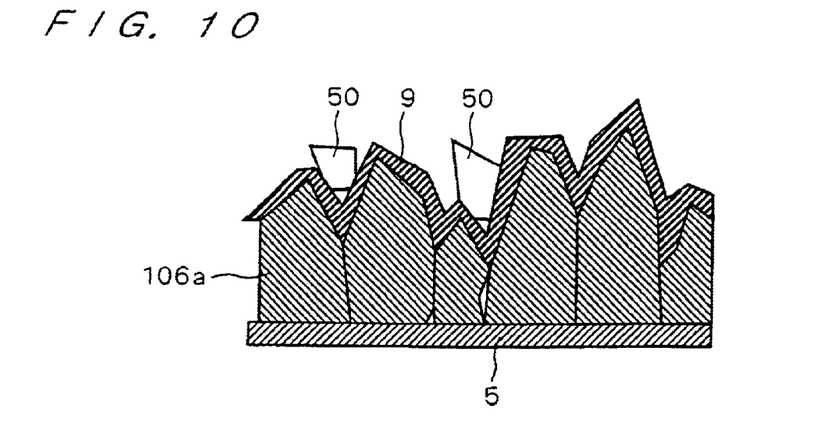

FIG. 10 is a cross section view showing a partially enlarged view of the structure shown in FIG. 9. Concretely, the titanium nitride film 5, the tungsten film 106 and the TEOS oxide film 9 formed in the recess 4 are shown partially enlarged. The abrasive material 50 becomes caught in the gaps between the grains 106a covered by the TEOS oxide film 9.

Figure 11:
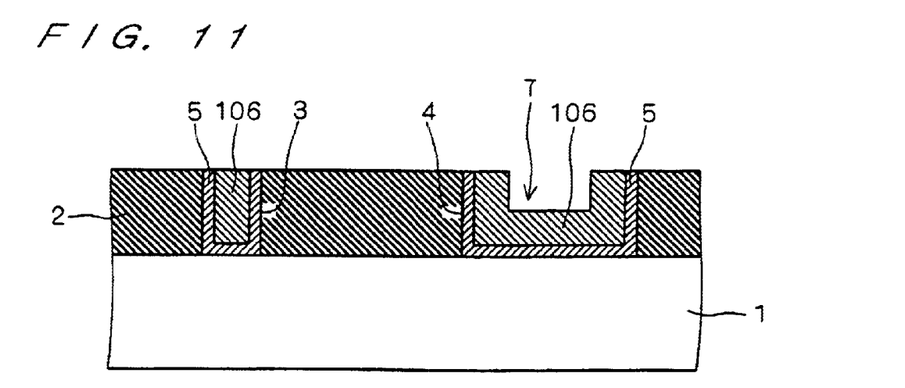
Figure 12:
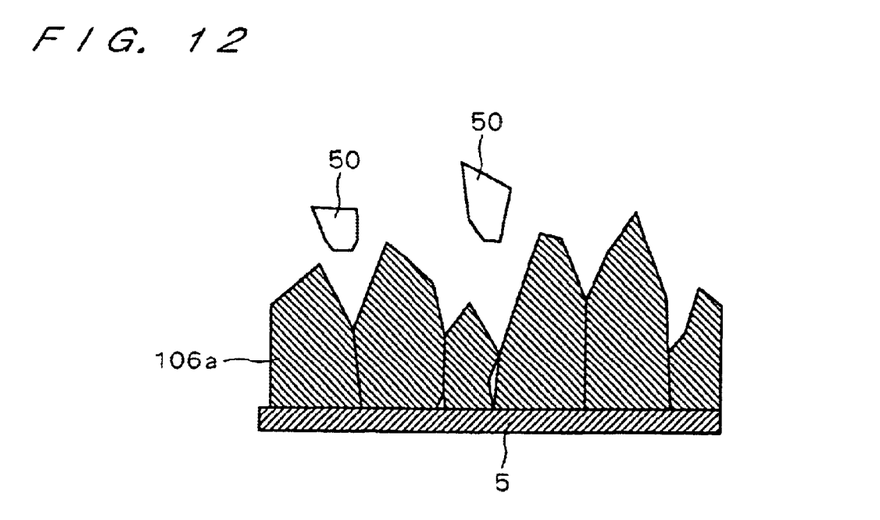

In reference to FIG. 11, next, the TEOS oxide film 9 is removed by means of a wet etching method using fluoric acid. FIG. 12 is a cross section view showing a partially enlarged view of the structure shown in FIG. 11 corresponding to FIG. 10. At the time when the TEOS oxide film 9 is removed by means of the wet etching process using fluoric acid, the abrasive material 50 which has been attached to the surface is also removed.

In this manner, in accordance with a method of manufacturing a semiconductor device according to the third preferred embodiment, the TEOS oxide film 9 in a thin film form is formed on the surface of the tungsten film 106 and, after that, CMP processing is carried out. Then, the TEOS oxide film 9 is removed after the CMP processing. Accordingly, even in the case that a portion of the abrasive material accumulates in the indentation 7 through the CMP processing, at the time when the TEOS oxide film 9 that has covered the surface of the tungsten film 106 is removed, the abrasive material 50 is also removed and, therefore, the abrasive material 50 can be prevented from remaining in the indentation 7.

Fourth Preferred Embodiment

Figure 13:
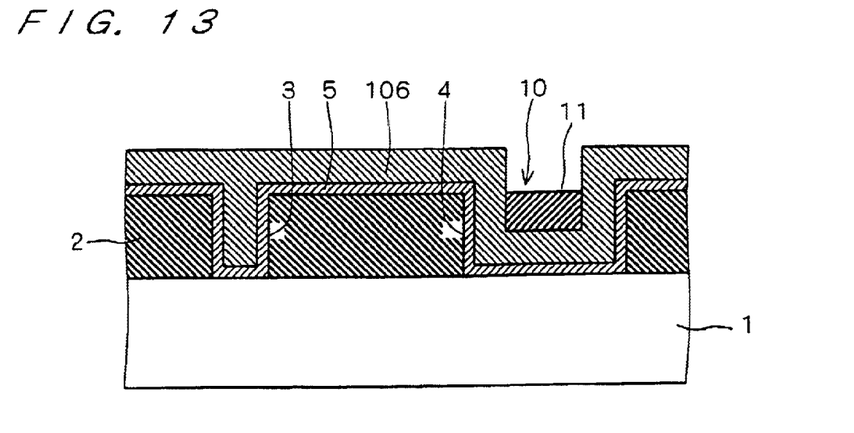
FIG. 13 to FIG. 15 are cross section views showing, in order of process steps, a method of manufacturing a semiconductor device according to a fourth preferred embodiment of the present invention.
Figure 14:
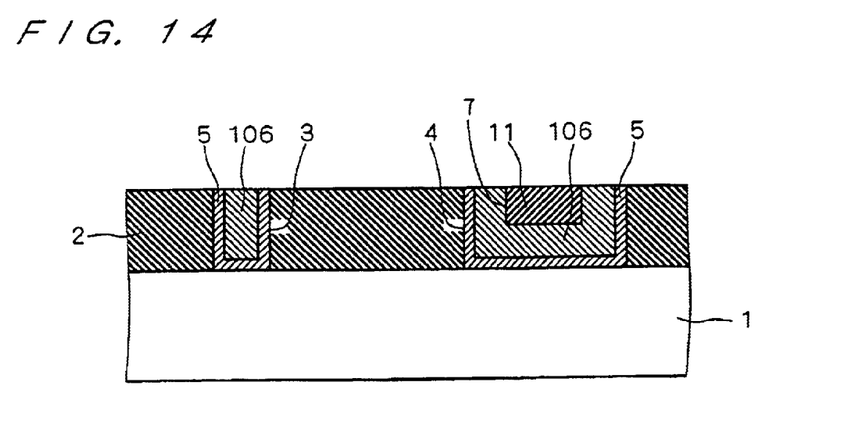
Figure 15:
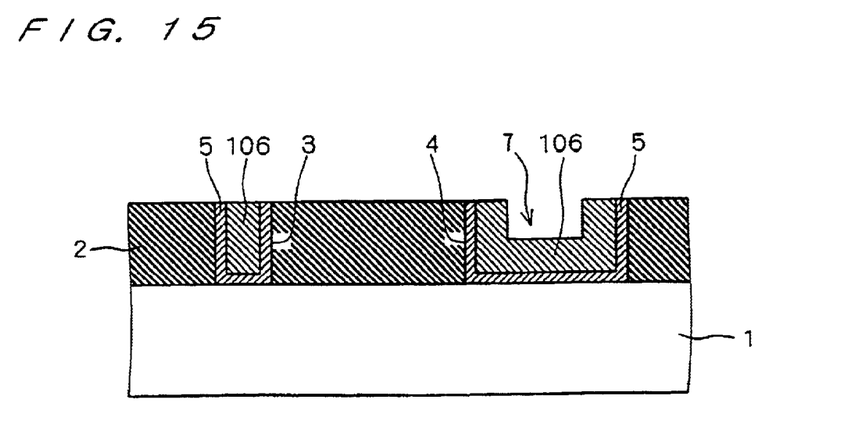

FIGS. 13 to 15 are cross section views showing, in order of process steps, a method of manufacturing a semiconductor device according to the fourth preferred embodiment of the present invention. In reference to FIG. 13, first, the structure shown in FIG. 19 is gained by being formed through the same steps as in a background art. Here, a TEOS oxide film is formed as an interlayer insulating film. In the surface of the tungsten film 106 a recess 10 is created due to the form of the recess 4. Next, an SOG (silicon on glass) film 11 is formed within the bottom of the recess 10 by means of a rotational application method. The film thickness of the SOG film 11 is a film thickness such that the level of the top surface of the SOG film 11 agrees with, or is higher than, the level of the top surface of the silicon oxide film 2. Here, the film thickness of the SOG film 11 is a film thickness such that the level of the top surface of the SOG film 11 agrees with the level of the top surface of the silicon oxide film 2. The film thickness or filling in property of the SOG film 11 can be adjusted by the rotational conditions or by the application amount.

In reference to FIG. 14, next, the tungsten film 106 and the titanium nitride film 5 are removed through polishing by means of a CMP method until the top surface of the silicon oxide film 2 becomes exposed. In reference to FIG. 15, next, the SOG film 11 within the recess 4 is removed by means of a wet etching method using fluoric acid. Since the etching rate of the SOG film 11 in fluoric acid is significantly larger than that of the silicon oxide film 2, the SOG film 11 only can be removed with almost no etching of the silicon oxide film 2.

In this manner in accordance with a method of manufacturing a semiconductor device according to the fourth preferred embodiment, after filling in the bottom of the recess 10 of the tungsten film 106 with the SOG film 11, CMP processing is carried out. Then, the SOG film 11 is removed after the CMP processing. Accordingly, the abrasive material does not accumulate in the indentation 7 as the time of CMP processing and, therefore, the abrasive material 50 can be prevented from remaining in the indentation 7.

In addition, the SOG film 11 is filled in within the bottom of the recess 10 and, therefore, the phenomenon (erosion) where the interlayer insulating film 2 is locally overpolished due to the recess 10 can also be limited at the time of the CMP processing.

Fifth Preferred Embodiment

Figure 16:
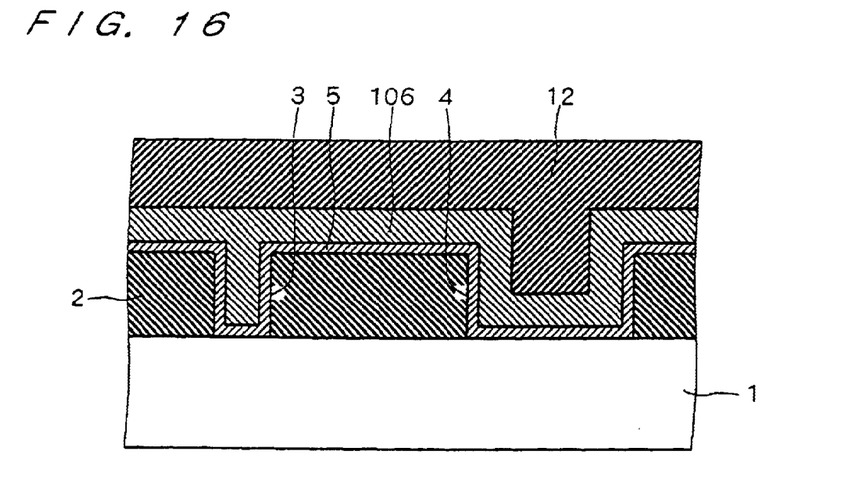
FIG. 16 to FIG. 18 are cross section views showing, in order of process steps, a method of manufacturing a semiconductor device according to a fifth preferred embodiment of the present invention.
Figure 17:
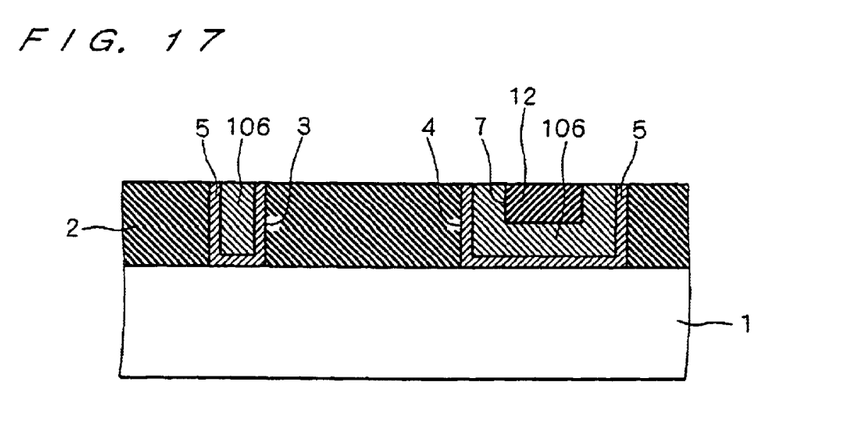
Figure 18:
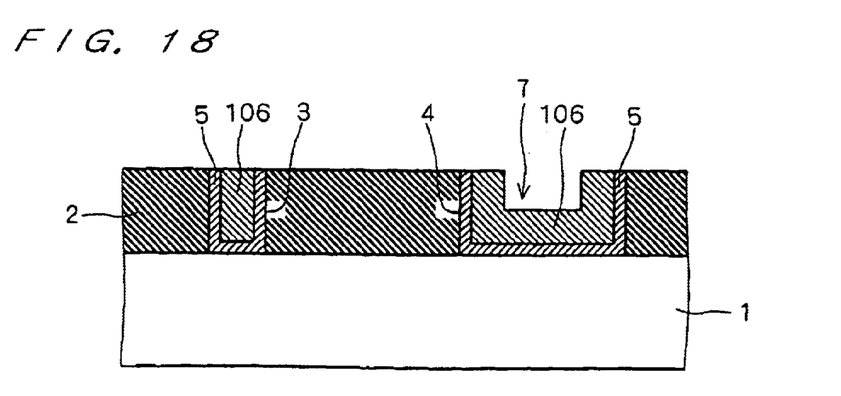

FIGS. 16 to 18 show section views showing, in order of process steps, a method of manufacturing a semiconductor device according to the fifth preferred embodiment of the present invention. In reference to FIG. 16, first, the structure shown in FIG. 19 is gained by being formed through the same steps as in a background art. A recess 10 is formed in the surface of the tungsten film 106. Next, a film of which the etching rate in fluoric acid is greater than that of the silicon oxide film 2 and which has excellent coverage properties for steps, for example a BPTEOS (boro phospho tetra etyle ortho silicate) film 12 is formed on the entire surface by means of a CVD method with a film thickness that can fill in the recess 10.

In reference to FIG. 17, next, the BPTEOS film 12 is removed through polishing by means of a CMP method until the top surface of the tungsten film 106 becomes exposed. Next, the tungsten film 106, the titanium nitride film 5 and the BPTEOS film 12 are removed through polishing by means of a CMP method until the top surface of the silicon oxide film 2 becomes exposed. In reference to FIG. 18, next, the BPTEOS film 12 within the recess 4 is removed by means of a wet etching method using fluoric acid. As for the etching rate in fluoric acid, that of the BPTEOS film 12 is significantly larger than that of the silicon oxide film 2 and, therefore, the BPTEOS film only can be removed through etching with almost no etching of the silicon oxide film 2.

In this manner, in accordance with a method of manufacturing a semiconductor device according to the fifth preferred embodiment, the recess 10 of the tungsten film 106 is filled in with the BPTEOS film 12 and, after that, CMP processing is carried out. Then, the BPTEOS film 12 is removed after the CMP processing. Accordingly, the abrasive material does not accumulate within the indentation 7 at the time of the CMP processing and, therefore, the abrasive material 50 can be prevented from remaining within the indentation 7.

In addition, since the BPTEOS film 12 is filled in within the recess 10, the phenomenon (erosion) where the interlayer insulating film 2 is locally overpolished due to the recess 10 can be limited at the time of CMP processing.

While the invention has been shown and described in detail, the foregoing description is in all aspects illustrative and not restrictive. It is therefore understood that numerous other modifications and variations can be devised without departing from the scope of the invention.

What is claimed is:

1. A method of manufacturing a semiconductor device, comprising the steps of:
   (a) preparing a substrate;
   (b) forming a first film on said substrate;
   (c) forming a recess by partially hollowing a top surface of said first film in the direction toward said substrate;
   (d) forming a second film on a structure obtained in said step (c) with a film thickness such that said recess is not completely filled in; and
   (e) removing through polishing said second film in a part which is located above said top surface of said first film,
   wherein a fine grain layer, which has grains of which the diameter is small to the degree that the abrasive material used for polishing in said step (e) does not easily become caught in the gaps between the grains, is formed on, at least, a top surface of said second film.

2. The method of manufacturing a semiconductor device according to claim 1, wherein said second film where the diameter of said grains in said fine grain layer is approximately 10 nm to 20 nm is formed in said step (d).

3. The method of manufacturing a semiconductor device according to claim 1, wherein said second film comprising said fine grain layer throughout all the film thickness is formed in said step (d).

4. The method of manufacturing a semiconductor device according to claim 1, wherein said second film having said fine grain layer in only said top surface is formed in said step (d).

5. The method of manufacturing a semiconductor device according to claim 1, wherein said recess is a recess which functions as an alignment mark.

6. The method of manufacturing a semiconductor device according to claim 1, wherein said second film is a metal film.

7. A method of manufacturing a semiconductor device, comprising the steps of:
   (a) preparing a substrate;
   (b) forming a first film on said substrate;
   (c) forming a recess by partially hollowing a top surface of said first film in the direction toward said substrate;
   (d) forming a second film on a structure obtained in said step (c) with a film thickness such that said recess is not completely filled in;
   (e) removing a top surface of said second film by means of isotropic etching; and
   (f) after said step (e), removing through polishing a part of said second film which is located above said top surface of said first film.

8. The method of manufacturing a semiconductor device according to claim 7, wherein said second film is removed by means of wet etching or isotropic etch back in said step (e).

9. The method of manufacturing a semiconductor device according to claim 7, wherein said recess is a recess which functions as an alignment mark.

10. The method of manufacturing a semiconductor device according to claim 7, wherein said second film is a metal film.

11. A method of manufacturing a semiconductor device, comprising the steps of:
    (a) preparing a substrate;
    (b) forming a first film on said substrate;
    (c) forming a first recess by partially hollowing a top surface of said first film in the direction toward said substrate;
    (d) forming a second film on a structure obtained in said step (c) with a film thickness such that said first recess is not completely filled in;
    (e) forming a third film with a film thickness such that the level of a top surface thereof agrees with, or is higher than, the level of said top surface of said first film in a second recess which is defined by a top surface of a part of said second film which is formed in said first recess;
    (f) removing through polishing a part of said second film which is located above said top surface of said first film; and
    (g) after said step (f), removing said third film which remains in said second recess.

12. The method of manufacturing a semiconductor device according to claim 11, wherein
    said third film is removed through wet etching in said step (g); and
    an etching rate of said third film in an etching solution used for said wet etching is significantly greater than an etching rate of said first film in said etching solution.

13. The method of manufacturing a semiconductor device according to claim 12, wherein
    said first film is a silicon oxide film;
    said third film is an SOG film; and
    said etching solution is a fluoric acid solution.

14. The method of manufacturing a semiconductor device according to claim 11, wherein said recess is a recess which functions as an alignment mark.

15. The method of manufacturing a semiconductor device according to claim 11, wherein said second film is a metal film.

* * * * *